United States Patent
Gouy-Pailler et al.

(10) Patent No.: US 9,871,364 B2
(45) Date of Patent: Jan. 16, 2018

(54) METHOD AND DEVICE FOR DETECTING ELECTRIC ARC IN A PHOTOVOLTAIC INSTALLATION

(71) Applicant: COMMISSARIAT A L'ENERGIE ATOMIQUE ET AUX ENERGIES ALTERNATIVES, Paris (FR)

(72) Inventors: Cédric Gouy-Pailler, Versailles (FR); Nicolas Chaintreuil, Montmelian (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 541 days.

(21) Appl. No.: 14/363,987

(22) PCT Filed: Dec. 6, 2012

(86) PCT No.: PCT/EP2012/074696
§ 371 (c)(1),
(2) Date: Jun. 9, 2014

(87) PCT Pub. No.: WO2013/083723
PCT Pub. Date: Jun. 13, 2013

(65) Prior Publication Data
US 2014/0301008 A1    Oct. 9, 2014

(30) Foreign Application Priority Data
Dec. 9, 2011    (FR) ...................... 11 61388

(51) Int. Cl.
*H02H 3/00* (2006.01)
*H02H 1/00* (2006.01)
(Continued)

(52) U.S. Cl.
CPC ..... *H02H 1/0092* (2013.01); *H01L 31/02021* (2013.01); *H02H 1/0015* (2013.01);
(Continued)

(58) Field of Classification Search
USPC ........................................... 361/42
See application file for complete search history.

(56) References Cited

U.S. PATENT DOCUMENTS

| 6,892,178 B1 | 5/2005 | Zacharia |
| 7,366,622 B1 | 4/2008 | Nemir et al. |

(Continued)

FOREIGN PATENT DOCUMENTS

| EP | 2 393 178 A2 | 12/2011 |
| FR | 2 912 848 A1 | 8/2008 |

(Continued)

OTHER PUBLICATIONS

Kusljevic et al., "Active power measurement algorithm for power system signals under non-sinusoidal conditions and wide-range frequency deviations", IET Generation; Transmission & Distribution, vol. 3, No. 1, 2009, pp. 57-65; cited in the ISR.

(Continued)

*Primary Examiner* — Ronald W Leja
(74) *Attorney, Agent, or Firm* — Westerman, Hattori, Daniels & Adrian, LLP

(57) ABSTRACT

A method for detecting an electrical arc in a photovoltaic installation includes measurement (E6) of voltage values at at least one point of the electrical circuit of the photovoltaic installation; digitization (E8) of the measured voltage values to form a sampling of data x; calculation (E10) of an estimation value y of the presence of an electrical arc based on a statistical calculation on the sampling of data and the inclusion of an omission factor Φ; and comparison (E12) of the estimation value y of the presence of an electrical arc with a threshold value to deduce therefrom the presence or absence of an electrical arc in the photovoltaic installation.

24 Claims, 3 Drawing Sheets

Figure 1:
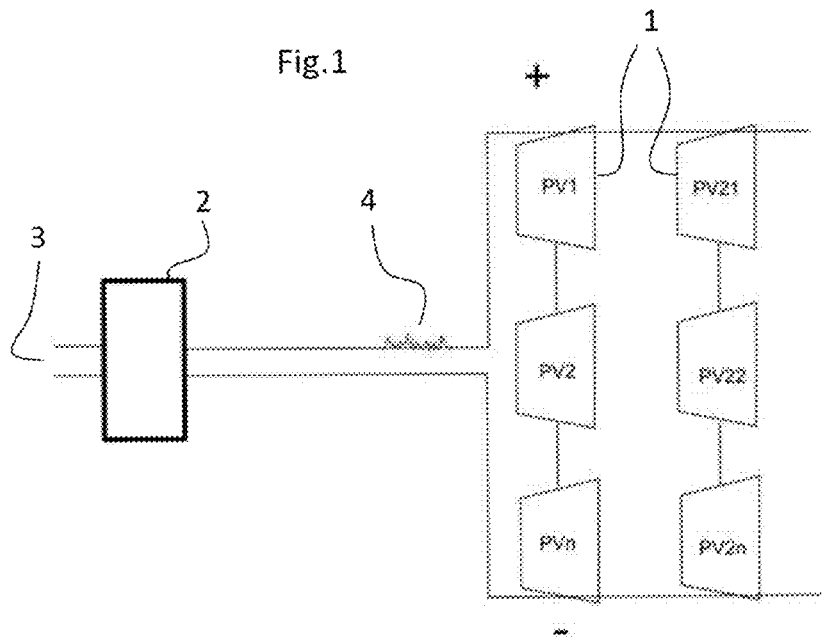

(51) Int. Cl.
*H01L 31/02* (2006.01)
*H02S 50/10* (2014.01)
*H02H 7/20* (2006.01)

(52) U.S. Cl.
CPC .............. *H02S 50/10* (2014.12); *H02H 7/20* (2013.01); *Y02E 10/50* (2013.01)

(56) References Cited

U.S. PATENT DOCUMENTS

| | | | |
|---|---|---|---|
| 8,570,017 | B2 | 10/2013 | Perichon et al. |
| 2010/0164459 | A1 | 7/2010 | Perichon et al. |
| 2011/0267721 | A1 | 11/2011 | Chaintreuil et al. |
| 2011/0301772 | A1* | 12/2011 | Zuercher ........... H01L 31/02021 700/293 |
| 2012/0318320 | A1* | 12/2012 | Robbins ............... H02H 1/0015 136/244 |
| 2014/0301008 | A1* | 10/2014 | Gouy-Pailler ....... H02H 1/0015 361/93.2 |
| 2015/0357972 | A1* | 12/2015 | Lespinats ................ H02S 50/10 324/761.01 |
| 2016/0276977 | A1* | 9/2016 | Chaintreuil ............. H02S 50/00 |

FOREIGN PATENT DOCUMENTS

| | | |
|---|---|---|
| WO | 98/27476 A1 | 6/1998 |
| WO | 2010/072717 A1 | 7/2010 |
| WO | 2011/058433 A1 | 5/2011 |
| WO | 2013/083723 A1 | 6/2013 |

OTHER PUBLICATIONS

Schimpf et al., "Recognition of Electric Arcing in the DC-wiring of Photovoltaic Systems", Telecommunications Energy Conference, Intelec 2009, 31st International, IEEE, Oct. 18, 2009, pp. 1-6; cited in the ISR.

International Search Report dated Feb. 18, 2013 issued in corresponding application No. PCT/EP2012/074696.

International Search Report and Written Opinion dated Jun. 27, 2014 issued in international application No. PCT/EP2014/053395 corresponding to co-pending U.S. Appl. No. 14/769,561; with English translation (16 pages) (D2 Schimpf et al. cited in the ISR and FR2912848 and WO2010/072717 cited in the description of the co-pending application, and corresponding US20110267721 and US20100164459, are not listed in this IDS since they were already listed in the IDS filed Jun. 9, 2014).

Braun et al., "Signal Processing for Fault Detection in Photovoltaic Arrays", 2012 IEEE International Conference on Acoustics, Speech, and Signal Processing (ICASSP 2012), Mar. 25, 2012, pp. 1681-1684 (4 pages); in English; cited in the ISR of co-pending U.S. Appl. No. 14/769,561.

International Search Report and Written Opinion dated Jun. 24, 2014 issued in international application No. PCT/EP2014/053438 corresponding to co-pending U.S. Appl. No. 14/767,628; with English translation (21 pages) (D1 Schimpf et al. cited in the ISR and FR2912848 and WO2010/072717 cited in the description of the co-pending application, and corresponding US20110267721 and US20100164459, are not listed in this IDS since they were already listed in the IDS filed Jun. 9, 2014).

Yao et al., "The Detection of DC Arc Fault: Experimental Study and Fault Recognition", Applied Power Electronics Conference and Exposition (APEC), 2012 27th Annual IEEE, Feb. 5, 2012, pp. 1720-1727; in English; cited in the ISR of co-pending U.S. Appl. No. 14/767,628.

Office Action dated Mar. 31, 2017 in co-pending U.S. Appl. No. 14/767,628; with PTO892; without returned SB08 (10 pages) (US20110267721 cited in the Office Action is not listed in this IDS since it was already listed in the IDS filed Jun. 9, 2014).

Office Action dated Oct. 13, 2017 in co-pending U.S. Appl. No. 14/767,628; without returned SB08 (10 pages) (the Schimpf) publication and U.S. Pat. No. 7,366,622 cited in the Office Action are not listed in this IDS since they were already listed in the IDS filed Jun. 9, 2014.

* cited by examiner

METHOD AND DEVICE FOR DETECTING ELECTRIC ARC IN A PHOTOVOLTAIC INSTALLATION

The invention relates to a method for detecting an electrical arc in a photovoltaic system. It relates also to a safety device detecting the appearance of electrical arcs, and a photovoltaic module and a photovoltaic system that are equipped with such a safety device detecting the appearance of electrical arcs.

Photovoltaic installations operate with high DC voltage and DC current, which brings with it risks of the appearance of electrical arcs. Such electrical arcs can occur as a result of a manipulation error, for example if an operator ill-advisedly opens a connector under load, or as a result of the degradation of the connections of the installation. These electrical arcs generate a strong plasma heat for a significant duration since, under DC voltage, the value of the voltage is never zero unlike an AC system, and said electrical arcs are consequently very dangerous for people and the installations. Furthermore, the incorporation of the photovoltaic modules in the roof of buildings risks triggering a fire in the rafters in the event of an electrical arc.

The photovoltaic installations can be linked to the electricity network via an inverter. In such a configuration, there are safety systems that make it possible to detect any electrical arc occurring on the electrical link between a span of photovoltaic modules and the inverter. However, these systems are inadequate since such an electrical arc is likely to occur on a photovoltaic module itself. There is no safety solution for such a risk.

The prior art document WO2010072717 proposes the detection of an electrical arc in a photovoltaic installation on the basis of the analysis of an ultrasound wave and the recognition of the ultrasound signature of an electrical arc in this wave. For this, this solution continuously analyzes the ultrasound signatures. The result of this is a method that requires complex calculation and a costly device.

The document FR2912848 describes a simplified method for detecting an electrical arc based on the simple measurement of voltage and the detection of its rapid increase. However, this method is inadequate for distinguishing between an electrical arc and distinct different events which also induce a voltage increase.

Thus, a general object of the invention is to propose a solution for detecting an electrical arc in a photovoltaic installation that is simple, inexpensive and reliable, in order to enhance the safety of such installations.

To this end, the invention is based on a method for detecting an electrical arc in a photovoltaic installation, characterized in that it comprises the following steps:
measurement of voltage values at at least one point of the electrical circuit of the photovoltaic installation;
digitization of the measured voltage values to form a sampling of data x;
calculation of an estimation value y of the presence of an electrical arc based on a statistical calculation on the sampling of data and the inclusion of an omission factor $\varphi$;
comparison of the estimation value y of the presence of an electrical arc with a threshold value to deduce therefrom the presence or absence of an electrical arc in the photovoltaic installation.

The statistical calculation can be based on the variance or standard deviation.

The omission factor can be combined with each sampling datum x to make it possible to define an increasingly low weight for the sampling data on each iteration, to take account of the history of the measured values and indirectly take account of the duration of any period of chaos.

The omission factor can depend on a sampling frequency.

The omission factor can be constant and chosen by observing the rules defined by the following table:

| Sampling frequency $F_{ech}$ | Omission factor $\Phi$ contained within the range |
|---|---|
| 50-300 kHz inclusive | [0.965; 0.975] |
| 301-750 kHz inclusive | [0.975; 0.985] |
| 751 kHz-8 MHz inclusive | [0.985; 0.995] |

The calculation of an estimation value of the presence of an electrical arc can implement the following calculations, repeated for each digitized datum x:
first of all, three variables a, b and c are recalculated as follows, based on the preceding values of these variables a, b and c:
$a \leftarrow \varphi a + x^2$
$b \leftarrow \varphi b + x$
$c \leftarrow \varphi c + 1$
then, the estimation value y of the presence of an electrical arc is calculated by the following formula:

$$y = \frac{a - b^2/c}{c - 5}$$

The method for detecting an electrical arc in a photovoltaic installation can comprise a processing initialization phase upon the switching-on of the safety device, which comprises the following steps:
initialization of the variables a, b, c at zero and of the omission factor;
iteration of the following calculations on a predefined number of data x:
$a \leftarrow \varphi a + x^2$
$b \leftarrow \varphi b + x$
$c \leftarrow \varphi c + 1$
then initialization of the electrical arc detection threshold by the following formula:

$$\text{threshold} = k \cdot \frac{a - b^2/c}{c - 5}$$

where k is a parameter between 5 and 200.

If the step of comparison of the estimation value y of the presence of an electrical arc with a threshold value satisfies y>threshold, then it can be estimated that there is an electrical arc in the photovoltaic installation, then the method can comprise a step consisting in intervening on the electrical circuit of the photovoltaic installation in the event of the detection of an electrical arc, in order to extinguish the electrical arc.

The invention relates also to a safety device for a photovoltaic installation, comprising one or more voltage measurement sensor(s), linked by a communication link to a processing unit, comprising an analogue-digital converter for digitizing the measurements received by the voltage measurement sensor(s), characterized in that the processing unit implements the method for detecting an electrical arc in the photovoltaic installation as described previously.

The processing unit can be linked by a communication means to an intervention device, the function of which is to stop the electrical arc, to eliminate any risk.

The invention relates also to a photovoltaic installation, characterized in that it comprises at least one safety device as described above.

These objects, features and advantages of the present invention will be explained in detail in the following description of a particular embodiment, given as a nonlimiting example in relation to the attached figures in which:

FIG. 1 schematically illustrates a photovoltaic installation.

Figure 2:
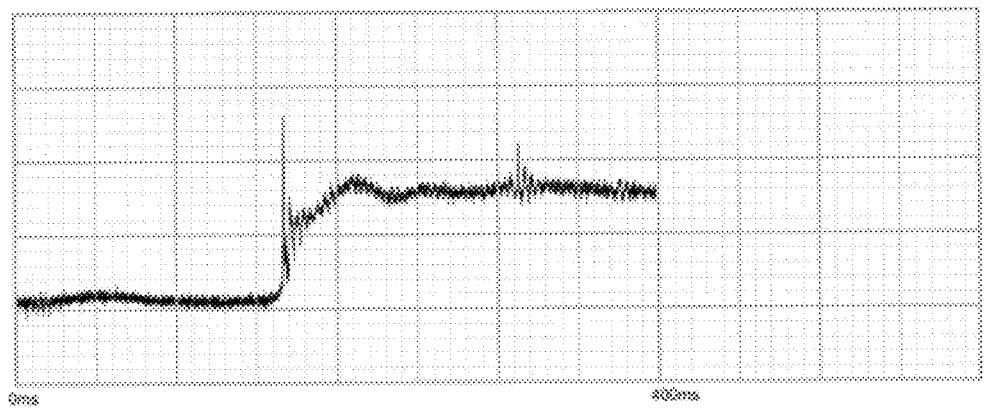

FIG. 2 represents an example of the trend of the voltage in a photovoltaic installation as a function of time, in the presence of an electrical arc.

Figure 3:
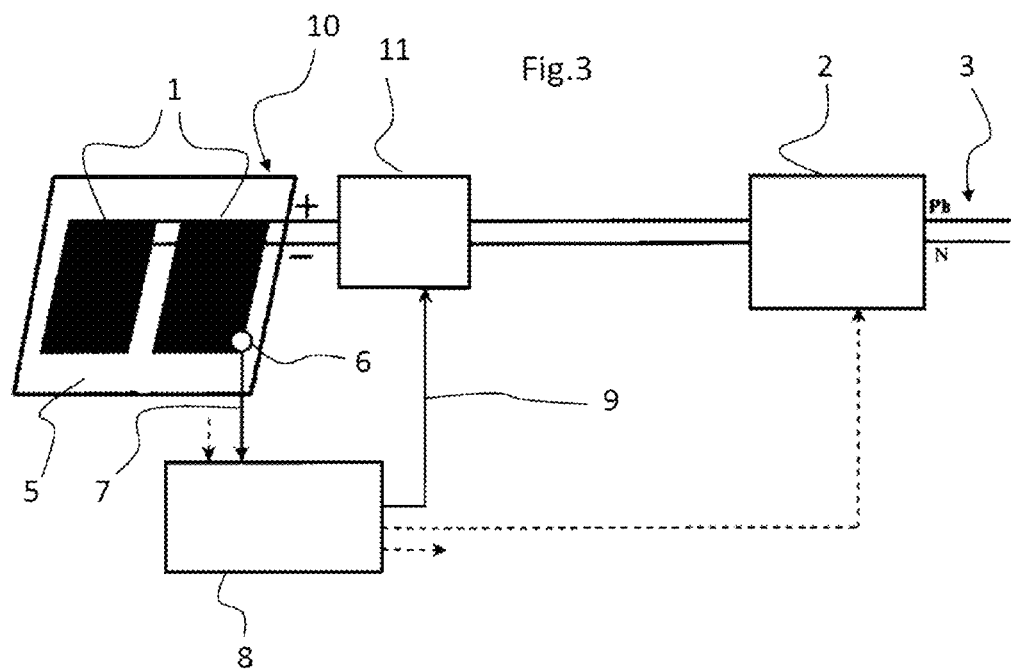

FIG. 3 schematically illustrates a safety device associated with a photovoltaic installation according to one embodiment of the invention.

Figure 4:
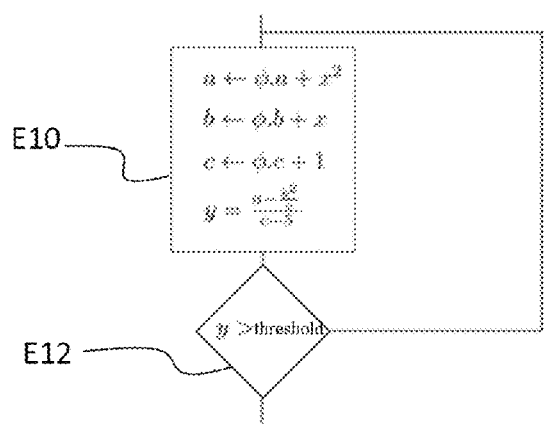

FIG. 4 illustrates a few steps of the method for detecting an electrical arc in a photovoltaic installation according to one embodiment of the invention.

Figure 5:
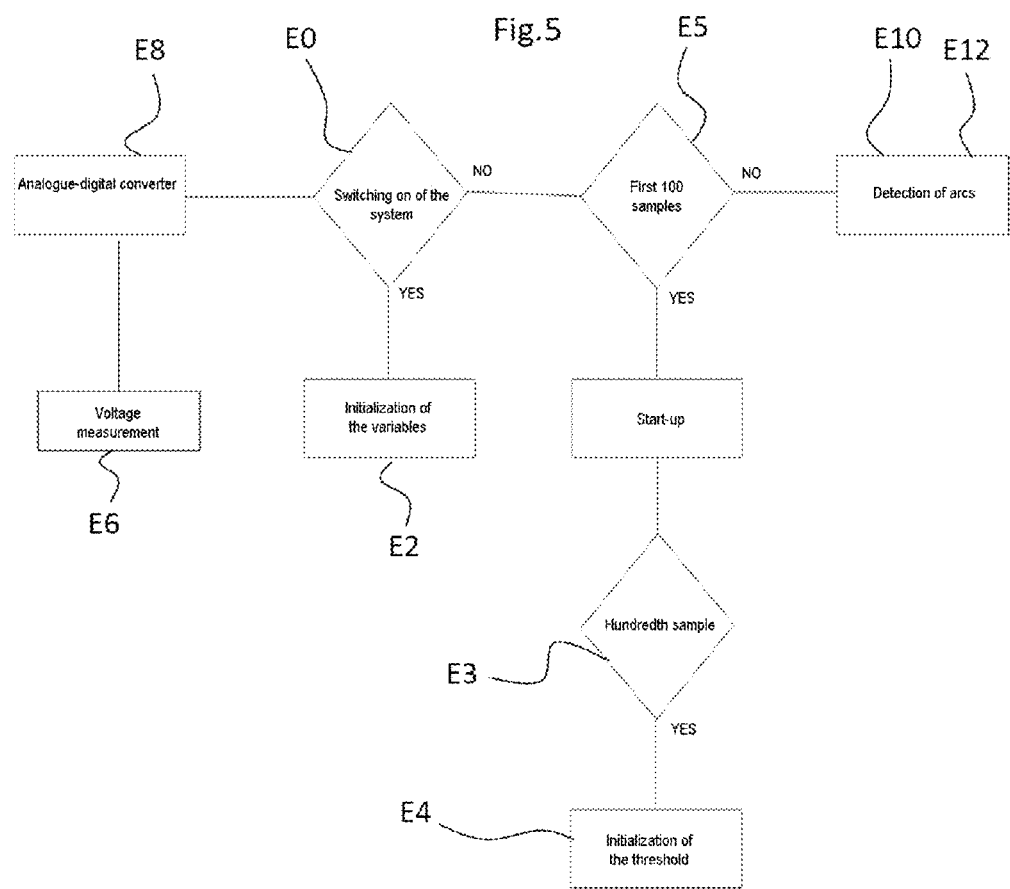

FIG. 5 more generally illustrates the method of detecting an electrical arc in a photovoltaic installation according to one embodiment of the invention.

The invention is based on just the measurement of the voltage in a photovoltaic installation. The latter, schematically represented in FIG. 1, comprises a number of photovoltaic modules 1 (PVi) linked to an inverter 2 which converts the DC current produced by the photovoltaic modules 1 into an AC current, for a link to a standard electricity network 3 which is not represented.

From a voltage measurement, the invention seeks to deduce the presence or absence of an electrical arc 4, which can be located on one or more photovoltaic module(s) 1, between these modules and an inverter 2, or at any point on the electrical circuit of the photovoltaic installation. An electrical arc provokes a significant increase in the voltage in the photovoltaic installation, and can take a form such as that illustrated in FIG. 2 according to one example. The increase in the voltage signal can occur at the same time as the arc, and last from a few milliseconds to a few hours. More generally, the amplitude of the signal obtained depends on the position of the detector and other parameters. This increase in the voltage is always accompanied by an abrupt increase in the energy of the signal, in other words by chaos in the signal.

FIG. 3 schematically represents a safety device for a photovoltaic installation 10 as described in FIG. 1, which comprises two photovoltaic modules 1 by way of a simplified example, mounted on a frame 5, which are linked to the conventional electricity network 3 via an inverter 2. The safety device comprises one or more voltage measurement sensor(s) 6, positioned for example on a photovoltaic module 1 and/or at any other point of the electrical circuit of the photovoltaic installation. This (or these) voltage measurement sensor(s) 6 is (are) linked by a communication link 7 to a processing unit 8 suitable for analyzing the data transmitted by the voltage measurement sensor(s) 6. This processing unit 8 is in turn linked by a communication means 9 to an intervention device 11, the function of which is to stop the electrical arc upon demand from the processing unit 8 in the event of an electrical arc, to eliminate any electrical risk and any future deterioration.

The processing unit 8 comprises an analogue-digital converter, for digitizing the data received from the voltage measurement sensor(s). Its function is to analyze the data received by the voltage measurement sensor(s) 6 and implement an electrical arc detection method which will be detailed below. For this, it can comprise a computation unit, such as a microcontroller, and storage means, or, more generally, any hardware and/or software component. It is worth noting that, since the data to be processed are digitized, it is possible to use one or more microcontrollers that already exist(s) within a photovoltaic installation to implement the electrical arc detection method which will be detailed below, without the addition of an additional component. The solution is therefore inexpensive.

Finally, the safety device 10 can be either arranged on one of the terminals at the output of the photovoltaic installation, or be located on each photovoltaic module, for example in its connection box. Any intermediate solution can naturally be considered.

The electrical arc detection method according to the invention will now be described in detail.

It comprises a voltage value sampling step. For this, different voltage values are measured over time, during a measurement step E6, and digitized, during a digitization step E8, by the digital converter of the processing unit, according to a selected sampling frequency $F_{ech}$. Then, these values are processed to deduce therefrom a detection of the appearance or not of an electrical arc.

According to this embodiment, this processing exploits the observation that the quantity of chaos present in the signal significantly increases during the appearance of an electrical arc. Thus, the principle retained consists in defining an estimation value of the presence of an electrical arc linked to the variance of the values obtained from the sampling.

Then, according to this embodiment, a parameter, called "omission factor", which depends on the sampling frequency $F_{ech}$, is used to take into account the history, in recent time, of the measured voltage values, and thus indirectly take into account the duration of any period of chaos. This omission factor thus makes it possible, for example, to dispense with a bandpass digital filter, which is always used in the prior art to eliminate certain noises which are not linked to an electrical arc, notably those created by the communication signals which pass through the installation to the processing unit, and which notably exhibit the particular feature of being of shorter duration. Also, the omission factor, notably by its dependency on the sampling frequency, makes it possible to optimize the link between the sampling frequency and the processing performed, by avoiding the mandatory complex adaptations between the bandpass filters and the sampling frequency of the prior art solutions.

According to the chosen embodiment, for each sample of voltage values measured and converted by the digital converter to supply data x, the following calculations are implemented:

First of all, the three variables a, b and c are defined as follows:

$a \leftarrow \varphi a + x^2$ $b \leftarrow \varphi b + x$ $c \leftarrow \varphi c + 1$ where $\varphi$ is the omission factor, which is constant and initialized as a function of the selected sampling frequency. As an example, the omission factor can be defined according to the value of the sampling frequency $F_{ech}$ by observing the rules according to the following table:

| Sampling frequency $F_{ech}$ | Omission factor $\Phi$ within the range |
| --- | --- |
| 50-300 kHz inclusive | [0.965; 0.975] |
| 301-750 kHz inclusive | [0.975; 0.985] |
| 751 kHz-8 MHz | [0.985; 0.995] |

As a variant, this omission factor may not depend on the sampling frequency, and, for example, be a constant less than 1.

Finally, the variable y, which represents an estimation value of the presence of an electrical arc, based on the variance of the sampled values modified by the inclusion of the omission factor φ, is calculated as follows:

$$y = \frac{a - b^2/c}{c - 5}$$

These calculations of the three variables a, b, c and of the estimation value y of the presence of an electrical arc are calculated in a calculation step E10 which is repeated for each new sampling datum x.

Finally, the electrical arc detection method comprises a step of comparison E12 of this estimation value y with a threshold value, to deduce therefrom the presence or absence of an electrical arc. If y>threshold, then the method considers that there is an electrical arc present and induces the safety shutdown of the photovoltaic installation, via the intervention device 11. For this, a command to stop the operation of the photovoltaic system can make it possible to stop the electrical arc, by thus eliminating the risk that a sustained electrical arc would represent, notably the risk of fire.

The preceding iteration, schematically represented by FIG. 4, therefore makes it possible to add a lower weight to a datum older than another, to take account of the history of the data obtained and their distribution in time. Any other calculation making it possible to set an increasingly low weight to each datum obtained on each iteration can make it possible to achieve, as a variant, a result that can be exploited to form variant embodiments.

The electrical arc detection method comprises a preliminary initialization step, which sets the threshold value by taking into account the first voltage values measured when the safety device is switched on E0.

At the initial instant, the variables a, b, c are initialized at 0, in an initialization step E2, then calculated according to the formulae explained above. The omission factor is similarly initialized according to predefined rules, as explained above by way of example. Then, the calculations as presented in the step E10 are repeated according to a predefined number of iterations, for example 100 iterations to take into account 100 voltage measurement samples. For this, the method comprises a step E5 of testing whether this predefined number of switch-on samples has been reached, to know whether the method is in an initialization phase or in a normal operating phase, implementing the steps E10, E12 explained previously. In the context of an initialization phase, the method implements an end-of-switching-on test step E3. When this end of switching-on is reached, that is to say the predefined number of switching-on iterations is reached, the resulting variables a, b, c are used to define a threshold value as follows, in the threshold value initialization step E4:

$$\text{threshold} = k \cdot \frac{a - b^2/c}{c - 5}$$

where k is a parameter, selected between 5 and 200, according to a trade-off chosen between two extremes: if k is at its lowest, all the electrical arcs are detected, but there is a risk of false alarm. If k is higher, the risk of false detection is reduced but the risk of not detecting an electrical arc is increased.

The processing implemented relies on an estimation of the appearance of an electrical arc based on the variance of a sampling of voltage measurements digitized and modified to incorporate an omission factor. The variance represents a good statistical method for evaluating the chaos of the sampling: naturally, any other calculation different from those presented above by way of example can be implemented, such as any calculation linked to the variance or any other equivalent statistical dimension, such as the standard deviation for example, and, more generally, any statistical calculation based on any statistical formula, using only the values of the sampling or their square.

The method described previously makes it possible to use an indicator similar to the statistical variance, that is to say one that considers the different second order moments of the sampling data, but obtained in a more stable and simple manner, by virtue of the introduction of the three variables a, b, c mentioned. The method recalculates the value of the three variables a, b, c at each time step by taking into account the history of these variables a, b, c, the square of the measured value $x^2$ (digitized value of the measured voltage) and the measured value x itself.

Furthermore, the concept of the invention is not limited to the photovoltaic devices described above but can be implemented in any kind of photovoltaic installation, with many photovoltaic modules.

The solution retained therefore provides a good response to the objects set and offers the following advantages:
- since the processing relies on just the measurement of the voltage, the method is simple;
- then, since the method implements a digitization to proceed with a single statistical calculation, it is very simple and does not require any significant computation power;
- finally, the device is simplified to the maximum and therefore inexpensive, since it requires no filter, because of the calculation which takes into account an omission factor. As a variant, it remains compatible with the additional and optional use of a filter;
- this solution is of course compatible with and complementary to other electrical arc detection solutions, and can therefore be combined with these other solutions.

The invention claimed is:

1. Method for detecting an electrical arc in a photovoltaic installation, which comprises:
   measuring a plurality of voltage values at different historical times at at least one point of an electrical circuit of the photovoltaic installation;
   digitizing the measured voltage values to form a sampling of data x;
   calculating an estimation value y of the presence of an electrical arc based on a statistical calculation on the sampling of data and inclusion of an omission factor Φ whose value is applied to modify each of the plurality of voltage values measured at different historical times in the sampling of data; and comparing the estimation value y of the presence of an electrical arc with a threshold value to deduce therefrom the presence or absence of an electrical arc in the photovoltaic installation,
wherein the calculating an estimation value y of the presence of an electrical arc comprises calculating three variables a, b, c each time a new sampling datum x is generated, by taking into account the history of the variables a, b, c.

2. Method for detecting an electrical arc in a photovoltaic installation according to claim 1, wherein the statistical calculation is based on the variance or standard deviation or a value similar to the variance or standard deviation.

3. Method for detecting an electrical arc in a photovoltaic installation according to claim 2, wherein the omission factor is combined with each sampling datum x to make it possible to define an increasingly low weight for the sampling data on each iteration, to take account of the history of the measured values and indirectly take account of the duration of a potential period of chaos.

4. Method for detecting an electrical arc in a photovoltaic installation according to claim 3, wherein the omission factor depends on a sampling frequency.

5. Method for detecting an electrical arc in a photovoltaic installation according to claim 4, wherein the omission factor is constant and chosen by observing the rules defined by the following table:

| Sampling frequency $F_{ech}$ | Omission factor $\Phi$ contained within the range |
| --- | --- |
| 50-300 kHz inclusive | [0.965; 0.975] |
| 301-750 kHz inclusive | [0.975; 0.985] |
| 751 kHz-8 MHz inclusive | [0.985; 0.995]. |

6. Method for detecting an electrical arc in a photovoltaic installation according to claim 2, wherein the omission factor depends on a sampling frequency.

7. Method for detecting an electrical arc in a photovoltaic installation according to claim 6, wherein the omission factor is constant and chosen by observing the rules defined by the following table:

| Sampling frequency $F_{ech}$ | Omission factor $\Phi$ contained within the range |
| --- | --- |
| 50-300 kHz inclusive | [0.965; 0.975] |
| 301-750 kHz inclusive | [0.975; 0.985] |
| 751 kHz-8 MHz inclusive | [0.985; 0.995]. |

8. Method for detecting an electrical arc in a photovoltaic installation according to claim 1, wherein the omission factor is combined with each sampling datum x to make it possible to define an increasingly low weight for the sampling data on each iteration, to take account of the history of the measured values and indirectly take account of the duration of a potential period of chaos.

9. Method for detecting an electrical arc in a photovoltaic installation according to claim 8, wherein the omission factor depends on a sampling frequency.

10. Method for detecting an electrical arc in a photovoltaic installation according to claim 9, wherein the omission factor is constant and chosen by observing the rules defined by the following table:

| Sampling frequency $F_{ech}$ | Omission factor $\Phi$ contained within the range |
| --- | --- |
| 50-300 kHz inclusive | [0.965; 0.975] |
| 301-750 kHz inclusive | [0.975; 0.985] |
| 751 kHz-8 MHz inclusive | [0.985; 0.995]. |

11. Method for detecting an electrical arc in a photovoltaic installation according to claim 1, wherein the omission factor depends on a sampling frequency.

12. Method for detecting an electrical arc in a photovoltaic installation according to claim 11, wherein the omission factor is constant and chosen by observing the rules defined by the following table:

| Sampling frequency $F_{ech}$ | Omission factor $\Phi$ contained within the range |
| --- | --- |
| 50-300 kHz inclusive | [0.965; 0.975] |
| 301-750 kHz inclusive | [0.975; 0.985] |
| 751 kHz-8 MHz inclusive | [0.985; 0.995]. |

13. Method for detecting an electrical arc in a photovoltaic installation according to claim 1, wherein the calculation of an estimation value of the presence of an electrical arc implements the following calculations, repeated for each digitized datum x:
first, three variables a, b and c are recalculated as follows, based on the preceding values of these variables a, b and c:
$a \leftarrow \Phi a + x^2$
$b \leftarrow \Phi b + x$
$c \leftarrow \Phi c + 1$
then, the estimation value y of the presence of an electrical arc is calculated by the following formula:

$$y = \frac{a - b^2/c}{c - 5}.$$

14. Method for detecting an electrical arc in a photovoltaic installation according to claim 13, comprising a processing initialization phase upon the switching-on of the safety device, which comprises:
initialization of the variables a, b, c at zero and of the omission factor;
iteration of the following calculations on a predefined number of data x:
$a \leftarrow \Phi a + x^2$
$b \leftarrow \Phi b + x$
$c \leftarrow \Phi c + 1$
then initialization of the electrical arc detection threshold by the following formula:

$$\text{threshold} = k \cdot \frac{a - b^2/c}{c - 5}$$

where k is a parameter between 5 and 200.

15. Method for detecting an electrical arc in a photovoltaic installation according to claim 1, wherein, if the comparing of the estimation value y of the presence of an electrical arc with a threshold value satisfies y>threshold, then it is estimated that there is an electrical arc in the photovoltaic installation, then the method comprising intervening on the electrical circuit of the photovoltaic installation in the event of the detection of an electrical arc, in order to extinguish the electrical arc.

16. Safety device for a photovoltaic installation, comprising:
    one or more voltage measurement sensor(s),
    a processing unit,
    the one or more voltage measurement sensor(s) being linked to the processing unit by a communication link,
    the processing unit comprising an analogue-digital converter for digitizing the measurements received by the voltage measurement sensor(s),
    wherein the processing unit implements the method for detecting an electrical arc in the photovoltaic installation according to claim 1.

17. Safety device for a photovoltaic installation according to claim 16, wherein the processing unit is linked by a communication means to an intervention device, the function of which is to stop the electrical arc, to eliminate any risk.

18. Photovoltaic installation comprising at least one safety device according to claim 16.

19. Method for detecting an electrical arc in a photovoltaic installation according to claim 1, wherein the omission factor is less than 1.

20. Method for detecting an electrical arc in a photovoltaic installation according to claim 19, wherein the omission factor is constant.

21. Method for detecting an electrical arc in a photovoltaic installation according to claim 1, wherein the omission factor $\Phi$ is applied iteratively to modify the plurality of voltage values measured at different historical times in the sampling of data.

22. Method for detecting an electrical arc in a photovoltaic installation, which comprises:
    measuring a plurality of voltage values at different historical times at at least one point of an electrical circuit of the photovoltaic installation;
    digitizing the measured voltage values to form a sampling of data x;
    calculating an estimation value y of the presence of an electrical arc based on a statistical calculation on the sampling of data and inclusion of an omission factor $\Phi$ whose value is applied to modify each of the plurality of voltage values measured at different historical times in the sampling of data; and
    comparing the estimation value y of the presence of an electrical arc with a threshold value to deduce therefrom the presence or absence of an electrical arc in the photovoltaic installation,
    wherein the omission factor depends on a sampling frequency, and
    wherein the omission factor is constant and chosen by observing the rules defined by the following table:

| Sampling frequency $F_{ech}$ | Omission factor $\Phi$ contained within the range |
| --- | --- |
| 50-300 kHz inclusive | [0.965; 0.975] |
| 301-750 kHz inclusive | [0.975; 0.985] |
| 751 kHz-8 MHz inclusive | [0.985; 0.995]. |

23. Method for detecting an electrical arc in a photovoltaic installation, which comprises:
    measuring a plurality of voltage values at different historical times at at least one point of an electrical circuit of the photovoltaic installation;
    digitizing the measured voltage values to form a sampling of data x;
    calculating an estimation value y of the presence of an electrical arc based on a statistical calculation on the sampling of data and inclusion of an omission factor $\Phi$ whose value is applied to modify each of the plurality of voltage values measured at different historical times in the sampling of data; and
    comparing the estimation value y of the presence of an electrical arc with a threshold value to deduce therefrom the presence or absence of an electrical arc in the photovoltaic installation,
    wherein the calculation of an estimation value of the presence of an electrical arc implements the following calculations, repeated for each digitized datum x:
    first, three variables a, b and c are recalculated as follows, based on the preceding values of these variables a, b and c:
    $a \leftarrow \Phi a + x^2$
    $b \leftarrow \Phi b + x$
    $c \leftarrow \Phi c + 1$
    then, the estimation value y of the presence of an electrical arc is calculated by the following formula:

$$y = \frac{a - b^2/c}{c - 5}.$$

24. Method for detecting an electrical arc in a photovoltaic installation according to claim 23, comprising a processing initialization phase upon the switching-on (E0) of the safety device, which comprises:
    initialization (E2) of the variables a, b, c at zero and of the omission factor;
    iteration of the following calculations on a predefined number of data x:
    $a \leftarrow \Phi a + x^2$
    $b \leftarrow \Phi b + x$
    $c \leftarrow \Phi c + 1$
    then initialization of the electrical arc detection threshold (E4) by the following formula:

$$\text{threshold} = k \cdot \frac{a - b^2/c}{c - 5}$$

where k is a parameter between 5 and 200.

* * * * *